United States Patent
Shim et al.

(10) Patent No.: US 8,410,597 B2
(45) Date of Patent: Apr. 2, 2013

(54) THREE DIMENSIONAL SEMICONDUCTOR DEVICE

(75) Inventors: Hyun Gue Shim, Ansan-si (KR); Hee Bong Lee, Asan-si (KR); Jin Wook Jeong, Asan-si (KR)

(73) Assignee: Hana Micron Inc., Asan-si (KR)

( * ) Notice: Subject to any disclaimer, the term of this patent is extended or adjusted under 35 U.S.C. 154(b) by 651 days.

(21) Appl. No.: 12/604,283

(22) Filed: Oct. 22, 2009

(65) Prior Publication Data

US 2010/0148338 A1 Jun. 17, 2010

(30) Foreign Application Priority Data

Dec. 15, 2008 (KR) .................. 10-2008-0127525

(51) Int. Cl.
*H01L 27/06* (2006.01)

(52) U.S. Cl. ............ 257/686; 257/690; 257/E27.026

(58) Field of Classification Search .......... 257/686, 257/787, 667, 778, E23.043, E27.006, E23.04; 174/528, 538
See application file for complete search history.

(56) References Cited

U.S. PATENT DOCUMENTS

| | | | |
|---|---|---|---|
| 6,710,246 B1* | 3/2004 | Mostafazadeh et al. | 174/528 |
| 7,745,918 B1* | 6/2010 | Woodyard | 257/686 |
| 2005/0248041 A1* | 11/2005 | Kuah et al. | 257/787 |
| 2008/0150100 A1* | 6/2008 | Hung et al. | 257/667 |
| 2008/0185720 A1 | 8/2008 | Wu | |

FOREIGN PATENT DOCUMENTS

JP 2008177265 A 7/2008

\* cited by examiner

*Primary Examiner* — Jarrett Stark
*Assistant Examiner* — Lawrence Tynes, Jr.
(74) *Attorney, Agent, or Firm* — Reinhart Boerner Van Deuren P.C.

(57) ABSTRACT

A 3D semiconductor device includes a conductive plate defining four sides and four recesses formed in the four sides, respectively. The conductive plate has first and second surfaces opposite to each other. A plurality of conductive leads are located in the recesses, respectively, and the conductive leads have first and second surfaces opposite to each other. A semiconductor die is attached onto the central area of the conductive plate. A plurality of conductive wires electrically connects the semiconductor die to the conductive leads. An encapsulant encloses, as in a capsule, the conductive plate, the conductive leads, the semiconductor die, and the conductive wires in such a manner that the first and second surfaces of the conductive plate and the first and second surfaces of the conductive leads are exposed to the outside.

14 Claims, 14 Drawing Sheets

THREE DIMENSIONAL SEMICONDUCTOR DEVICE

CROSS REFERENCE TO RELATED APPLICATION

The present application claims priority to Korean Patent Application Number 10-2008-0127525 filed on Dec. 15, 2008, the entire contents of which application is incorporated herein for all purposes by this reference.

BACKGROUND OF THE INVENTION

1. Field of the Invention

The present invention relates to a three-dimensional (3D) semiconductor device.

2. Description of Related Art

As recently electronic appliances have a thin and light profile and support multiple functions, research and development is underway in order to develop semiconductor devices, which can be mounted with a thin profile on electronic appliances while housing a plurality of semiconductor dies.

Most semiconductor devices, and particularly, a semiconductor device including lead frames, have a substantially rectangular die pad onto which a semiconductor die is attached. However, when a plurality of semiconductor dies is to be attached, it is difficult to array and locate the semiconductor dies. Furthermore, the semiconductor device generates a great amount of heat as a great number of semiconductor dies are provided. Accordingly, it is necessary to enhance heat dissipation efficiency without enlarging the semiconductor device. Moreover, in order to vertically stack semiconductor dies having a variety of functions and types, it is necessary to suitably array and locate input and output terminals on the upper and lower surfaces of the semiconductor device without compromising its design.

The information disclosed in this Background of the Invention section is only for enhancement of understanding of the background of the invention and should not be taken as an acknowledgment or any form of suggestion that this information forms the prior art that is already known to a person skilled in the art.

BRIEF SUMMARY OF THE INVENTION

Various aspects of the present invention provide a three-dimensional (3D) semiconductor device, which allows a plurality of semiconductor dies to be efficiently arrayed and located, improves heat dissipation efficiency, and facilitates wire bonding and stacking.

In an aspect of the invention, the 3D semiconductor device may include a conductive wire, a plurality of conductive leads, a semiconductor die, a plurality of conductive wires, and an encapsulant. The conductive plate may define four sides and four recesses formed in the four sides, respectively, and have first and second surfaces opposite to each other. The conductive leads may be located in a corresponding recess, respectively, and may have first and second surfaces opposite to each other. The semiconductor die may be bonded onto the central area of the conductive plate. The conductive wires may electrically connect the semiconductor die to the conductive leads. The encapsulant may enclose, as in a capsule, the conductive plate, the conductive leads, the semiconductor die, and the conductive wires in such a manner that the first and second surfaces of the conductive plate and the first and second surfaces of the conductive leads are exposed.

The conductive plate may further have a third surface opposite to the first surface, located between the first and second surfaces. The third surface may connect the recesses with each other, and the semiconductor die may be attached onto a central portion of the third surface.

The leads may further have a third surface opposite to the first surface, located between the first and second surfaces. The conductive wires may be connected to the third surface.

The 3D semiconductor device may further include at least one second semiconductor die attached onto the first surface of the conductive plate, wherein the second semiconductor die is electrically connected to the first surface of the conductive leads by a second conductive wire; and a second encapsulant enclosing the second semiconductor die and the second conductive wire.

The 3D semiconductor device may further include at least one second semiconductor die attached onto the third surface of the conductive plate, wherein the second semiconductor die is electrically connected to the third surface of the conductive leads by a second conductive wire; and a second encapsulant enclosing the second semiconductor die and the second conductive wire A plurality of the 3D semiconductor devices may be stacked one on another in the vertical direction.

A different type of second semiconductor device may be stacked on the three-dimensional semiconductor device in the vertical direction.

The 3D semiconductor device may further include at least one second semiconductor die attached onto the second surface of the conductive plate, wherein the second semiconductor die is electrically connected to the second surface of the conductive leads by a second conductive wire; and a second encapsulant enclosing the second semiconductor die and the second conductive wire.

The 3D semiconductor device may further include a spacer attached onto an underside of the semiconductor die; a second semiconductor die attached onto the spacer, wherein the second semiconductor die is electrically connected to the first surface of the conductive leads by a second conductive wire; and a second encapsulant enclosing the spacer, the second semiconductor die, and the second conductive wire.

In another aspect of the invention, the 3D semiconductor device may include a conductive plate, a conductive wire, a plurality of conductive leads, first and second semiconductor dies, a plurality of first and second conductive wires, and an encapsulant. The conductive plate may define four sides and four recesses formed in the four sides, respectively, and have first and second surfaces opposite to each other. The conductive leads may be located in the recess, respectively, and have first and second surfaces opposite to each other. The first semiconductor die may be bonded onto the upper central area of the conductive plate, and the second semiconductor die may be bonded onto the lower central area of the conductive plate. The first conductive wires may electrically connect the first semiconductor die to the conductive leads, and the second conductive wires may electrically connect the second semiconductor die to the conductive leads. The encapsulant may enclose, as in a capsule, all of the conductive plate, the conductive leads, the first and second semiconductor dies, and the first and second conductive wires such that the first and second surfaces of the conductive plate and the first and second surfaces of the conductive leads are exposed to the outside.

The conductive plate may further have a third surface opposite to the first surface, located between the first and second surfaces, wherein the third surface connects the recesses with each other, and wherein the first semiconductor die is attached onto a central portion of the third surface; and a fourth surface opposite to the first surface, located between the first and second surfaces, wherein the third surface connects the recesses with each other, and wherein the second semiconductor die is attached onto a central portion of the fourth surface.

The leads further may further have a third surface opposite to the first surface, located between the first and second surfaces, wherein the conductive wires are connected to the third surface; and a fourth surface opposite to the first surface, located between the first and second surfaces, wherein the conductive wires are connected to the fourth surface.

The 3D semiconductor device may further include at least one third semiconductor die attached onto the first surface of the conductive plate. The third semiconductor die may be electrically connected to the first surface of the conductive leads by a third conductive wire, and the third semiconductor die and the third conductive wire may be enclosed by the encapsulant.

The 3D semiconductor device may further include at least one third semiconductor die attached onto the third or fourth surface of the conductive plate. The third semiconductor die may be electrically connected to the third or fourth surface of the conductive leads by a third conductive wire, and the third semiconductor die and the third conductive wire may be enclosed by the encapsulant.

A plurality of the 3D semiconductor devices may be stacked one on another in the vertical direction.

A different type of second semiconductor device may be stacked on the three-dimensional semiconductor device in the vertical direction.

According to exemplary embodiments of the invention, more semiconductor dies can be mounted compared to conventional semiconductor devices. In addition, the semiconductor dies can be easily and efficiently arrayed and arranged.

Furthermore, a conventional die pad of a lead frame or a substrate is adapted from a fixed shape to facilitate the array and arrangement of semiconductor dies, as well as wire bonding. An area under a semiconductor device is etched, a semiconductor die can be attached onto the etched area, which was not used in the related art, and other semiconductor dies can be attached onto other areas. Accordingly, more semiconductor dies can be efficiently mounted.

In addition, large portions of the conductive plate are exposed to the outside of the encapsulant, greatly improving heat dissipation efficiency.

Moreover, symmetrical input and output terminals can be provided on the upper and lower portions, respectively, without compromising the design of the semiconductor device. This, as a result, facilitates stacking in the vertical direction.

The methods and apparatuses of the present invention have other features and advantages which will be apparent from or are set forth in more detail in the accompanying drawings, which are incorporated herein, and the following Detailed Description of the Invention, which together serve to explain certain principles of the present invention.

BRIEF DESCRIPTION OF THE DRAWINGS

FIGS. 9A through 9C illustrate the 3D semiconductor device in accordance with another or a further exemplary embodiment of the invention, after encapsulation is performed, in which FIG. 9A is a side elevation view, FIG. 9B is a top plan view, and FIG. 9C is a bottom view of the 3D semiconductor device;

FIGS. 15A through 15C illustrate the 3D semiconductor device in accordance with another or a further exemplary embodiment of the invention, after encapsulation is performed, in which FIG. 15A is a side elevation view, FIG. 15B is a top plan view, and FIG. 15C is a bottom view of the 3D semiconductor device;

FIGS. 22A through 22C illustrate the 3D semiconductor device in accordance with still or yet another exemplary embodiment of the invention, after encapsulation is performed, in which FIG. 22A is a side elevation view, FIG. 22B is a top plan view, and FIG. 22C is a bottom view of the 3D semiconductor device;

DETAILED DESCRIPTION OF THE INVENTION

Figure 1:
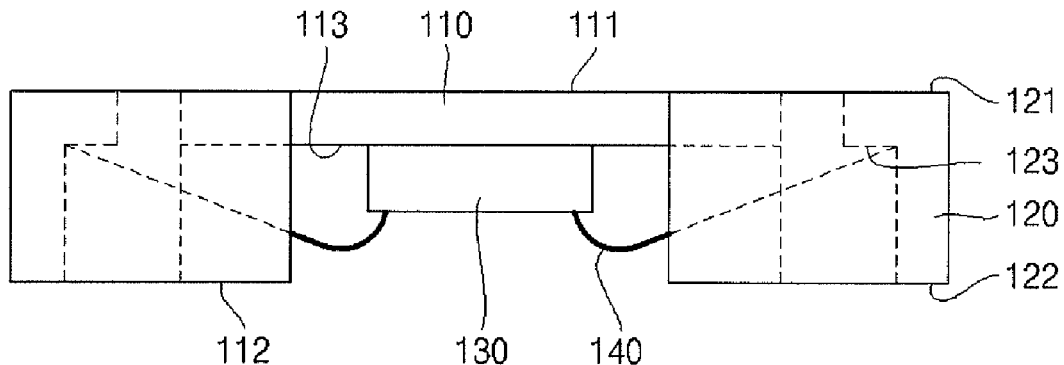
FIG. 1 is a cross-sectional view illustrating a 3D semiconductor device in accordance with one exemplary embodiment of the invention, after wire bonding is performed.

Reference will now be made in detail to various embodiments of the present invention(s), examples of which are illustrated in the accompanying drawings and described below. While the invention(s) will be described in conjunction with exemplary embodiments, it will be understood that present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Above all, reference should be made to the drawings, in which the same reference numerals and signs are used throughout the different drawings to designate the same or similar components.

Figure 2:
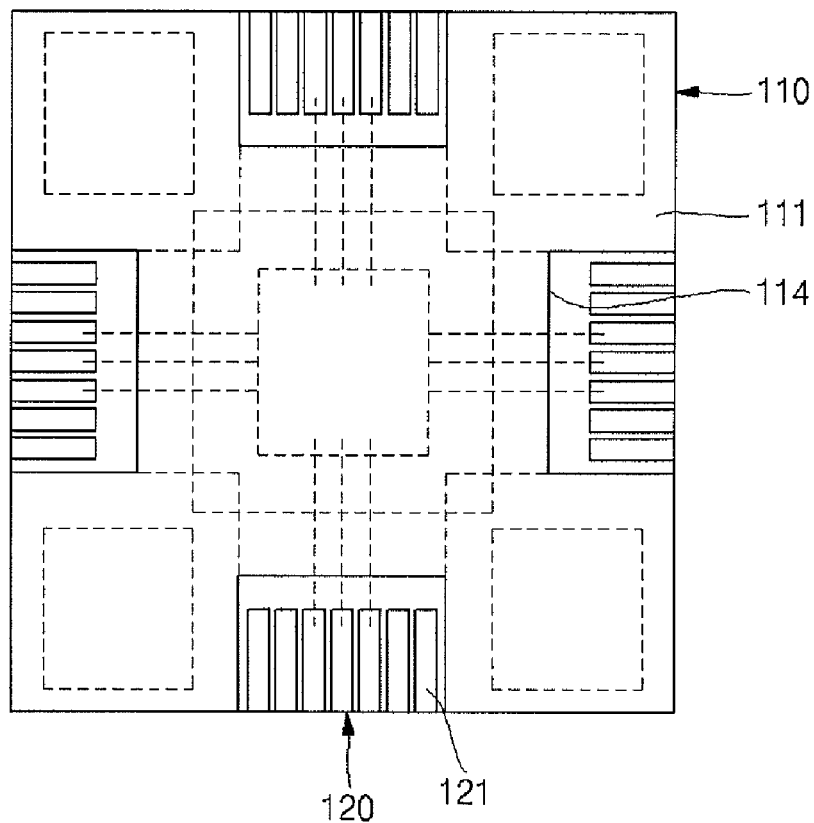
FIG. 2 is a top plan view of the 3D semiconductor device shown in FIG. 1.
Figure 3:
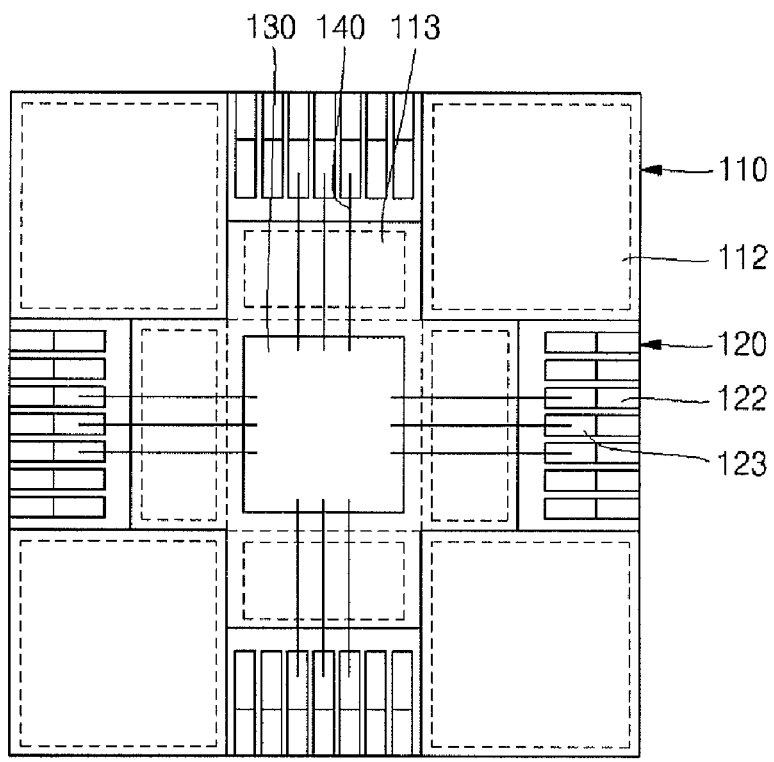
FIG. 3 is a bottom view of the 3D semiconductor device shown in FIG. 1.
Figure 4:
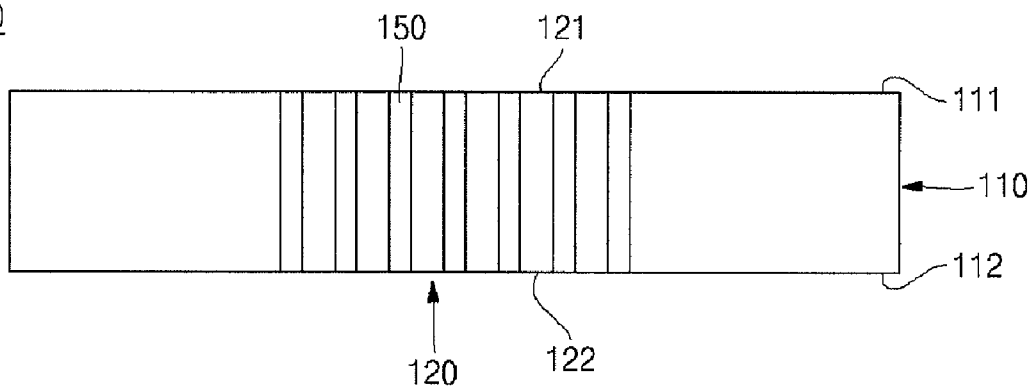
FIG. 4 is a side elevation view of the 3D semiconductor device shown in FIG. 1.
Figure 5:
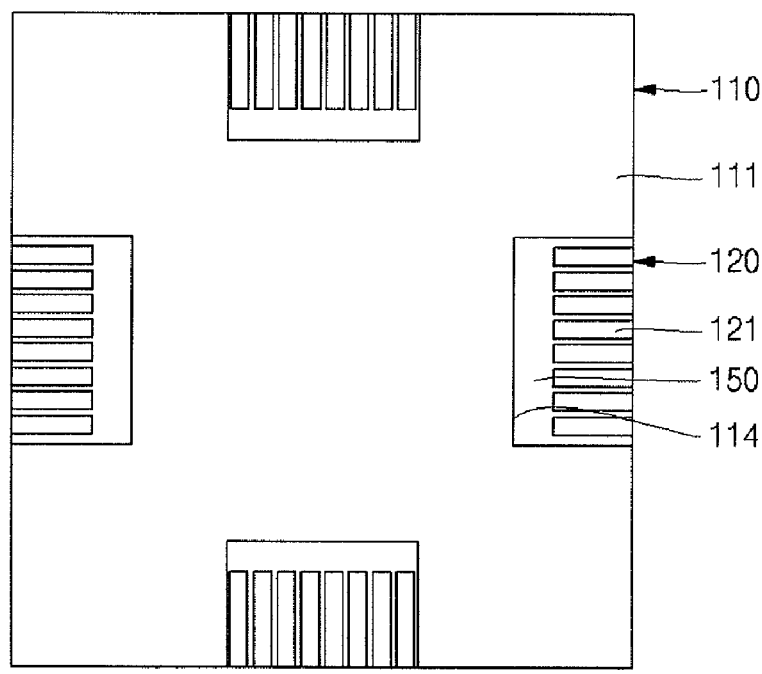
FIG. 5 is a top plan view illustrating the 3D semiconductor device in accordance with one exemplary embodiment of the invention, after encapsulation is performed.
Figure 6:
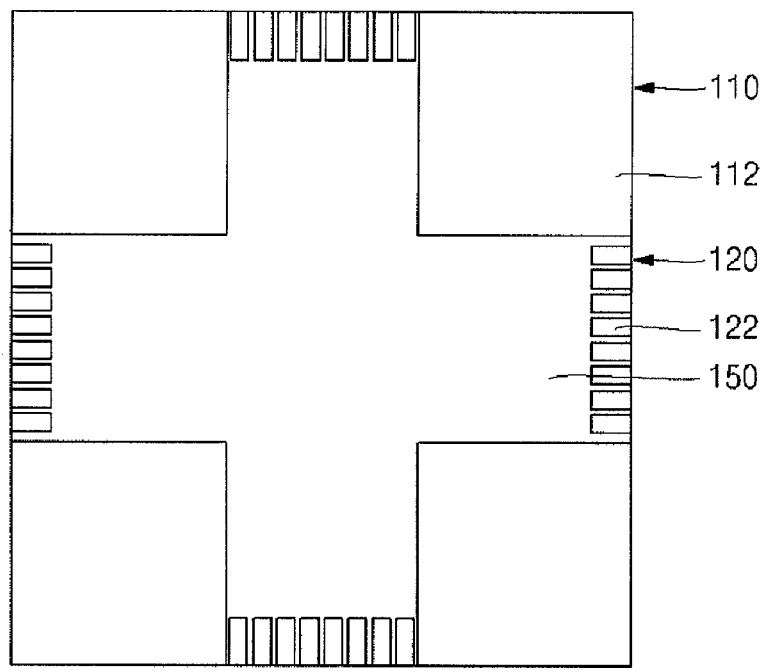
FIG. 6 is a bottom view of the 3D semiconductor device shown in FIG. 5.

FIG. 1 is a cross-sectional view illustrating a 3D semiconductor device in accordance with one exemplary embodiment of the invention, after wire bonding is performed, FIG. 2 is a top plan view of the 3D semiconductor device shown in FIG. 1, FIG. 3 is a bottom view of the 3D semiconductor device shown in FIG. 1, FIG. 4 is a side elevation view of the 3D semiconductor device shown in FIG. 1, FIG. 5 is a top plan view illustrating the 3D semiconductor device in accordance with one exemplary embodiment of the invention, after encapsulation is performed, and FIG. 6 is a bottom view of the 3D semiconductor device shown in FIG. 5.

As shown in FIGS. 1 through 6, the 3D semiconductor device 100 in accordance with one exemplary embodiment of the invention includes a conductive plate 110, a plurality of conductive leads 120, a semiconductor die 130, a plurality of conductive wires 140, and an encapsulant 150.

The conductive plate 110 has a substantially rectangular configuration with four (4) sides. Four (4) recesses 114 are formed with a predetermined depth, in substantially the middle of the four sides, respectively. In addition, the conductive plate 110 has a substantially planar first surface 111 and a substantially planar second surface 112 opposite to the first surface 111. The conductive plate 110 also has a third surface 113, which is located opposite to the first surface 111, between the first and second surfaces 111 and 112, so as to connect the recesses 114 into the form of a cross. The semiconductor die 130 is bonded onto the central portion of the third surface 113. The thickness between the first and third surfaces 111 and 113 is less than that between the first and second surfaces 111 and 112. The part of the conductive plate 110 between the first and second surfaces 111 and 112 can act as a heat sink in the semiconductor device 100 since the thickness between the first and second surfaces 111 and 112 is greater than that between the first and third surfaces 111 and 113. Dotted lines in FIGS. 2 and 3 denote the areas onto which different semiconductor dies can be further attached. The conductive plate 110 can be made of, but not limited to, Cu, Cu alloy, Cu—Ni alloy, Cu—Fe alloy, alloy 42, or an equivalent thereof.

The conductive leads 120 are arrayed in line inside the recesses 114 of the conductive plate 110. Each of the conductive leads 120 has a substantially planar first surface 121 and a substantially planar second surface 122 opposite to the first surface 121. The conductive lead 120 also has a third surface 123 opposite to the first surface 121, formed between the first and second surfaces 121 and 122. The thickness between the first and third surfaces 121 and 123 is relatively smaller than that between the first and second surfaces 121 and 122. In addition, the length of the first surface 121 is relatively greater than that of the second surface 122. The conductive lead 120 can be made of, but not limited to, Cu, Cu alloys, Cu—Ni alloy, Cu—Fe alloy, alloy 42, or an equivalent thereof.

The first surface 121 of the conductive lead 120 is flush with the first surface 111 of the conductive plate 110, the second surface 122 of the conductive lead 120 is flush with the second surface 112 of the conductive plate 110, and the third surface 123 of the conductive lead 120 is flush with the third surface 113 of the conductive plate 110.

The semiconductor die 130 is bonded onto substantially the central area of the conductive plate 110. Specifically, the semiconductor die 130 is bonded onto substantially the central area of the third surface 113 of the conductive plate 110. However, the semiconductor die 130 can also be bonded onto the areas denoted by dotted lines in FIGS. 2 and 3 as described above.

The thickness of the semiconductor die 130 is less than the thickness between the first and second surfaces 111 and 112 of the conductive plate 110. Specifically, the thickness of the semiconductor die 130 is less than the thickness between the first and second surfaces 121 and 122 of the conductive lead 120. More particularly, the thickness of the semiconductor die 130 is less than the distance from the third surface 113 to the second surface 112 of the conductive plate 110. Accordingly, the thickness of the semiconductor die 130 is less than the distance from the third surface 123 to the second surface 122 of the conductive lead 120.

The conductive wires 140 electrically connect the semiconductor die 130 to a plurality of conductive leads 120. The loop of the conductive wires 140 does not protrude beyond the second surface 112 of the conductive plate 110 or the second surface 122 of the conductive lead 120. This configuration can ensure a thin profile to the semiconductor device 100 by preventing the encapsulant 150, which will be described layer, from bulging above the second surface 112 of the conductive plate 110 or the second surfaces 122 of the conductive leads 120. The conductive wires 140 can be in the form of, but not limited to, Au wires, Cu wires, or an equivalent thereof.

The encapsulant 150 encloses, as in a capsule, the conductive plate 110, the conductive leads 120, the semiconductor die 130, and the conductive wires 140 in such a manner that the first and second surfaces 111 and 112 of the conductive plate 110 and the first and second surfaces 121 and 122 of the conductive leads 120 are exposed to the outside. In this manner, as shown in FIG. 5, the first surface 111 of the conductive plate 110 is completely exposed to the outside and the first surfaces 121 of the conductive leads 120 are exposed through the encapsulant 150 provided in the recesses 114. In addition, as shown in FIG. 6, the second surface 112 of the conductive plate 110 is exposed at four corners of the encapsulant 150, and the second surfaces 122 of the conductive leads 120 are exposed at respective ends of the encapsulant 150. Furthermore, as shown in FIG. 4, the sides of the conductive plate 110 and the conductive leads 120 are exposed through the sides of the encapsulant 150. The encapsulant 150 can be made of, but not limited to, an epoxy molding compound or an equivalent thereof.

Figure 7:
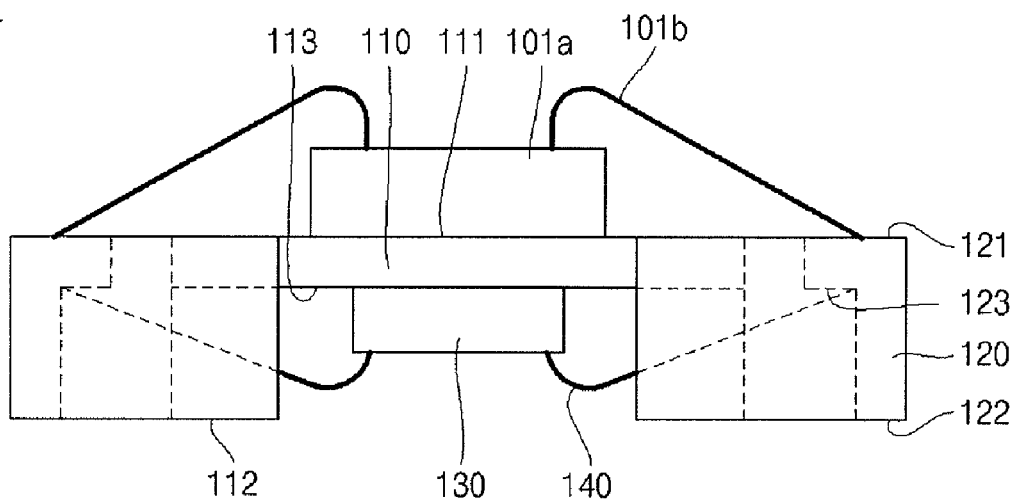
FIG. 7 is a cross-sectional view illustrating a 3D semiconductor device in accordance with another exemplary embodiment of the invention, after wire bonding is performed.

FIG. 7 is a cross-sectional view illustrating a 3D semiconductor device 101 in accordance with another exemplary embodiment of the invention, which is wire-bonded.

As shown in FIG. 7, in the 3D semiconductor device 101 in accordance with another exemplary embodiment of the invention, at least one second semiconductor die 101a is bonded onto a first surface 111 of a conductive plate 110 and is electrically connected to first surfaces 121 of conductive leads 120 by second conductive wires 101b. In addition, the second semiconductor die 101a and the second conductive wires 101b can be enclosed by an encapsulant (not shown).

Figure 8:
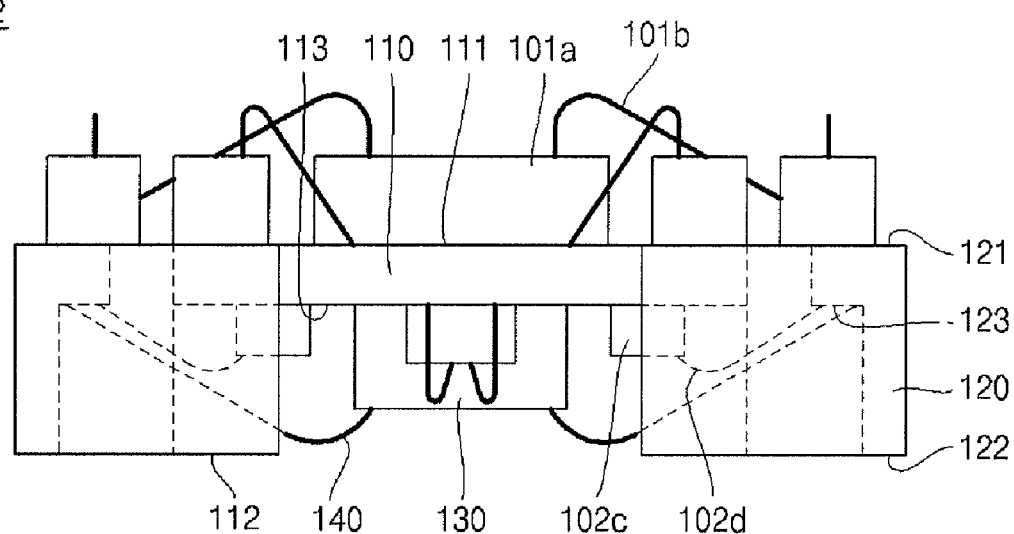
FIG. 8 is a cross-sectional view illustrating a 3D semiconductor device in accordance with a further exemplary embodiment of the invention, after wire bonding is performed.

FIG. 8 is a cross-sectional view illustrating a 3D semiconductor device 102 in accordance with a further exemplary embodiment of the invention, which is wire-bonded.

As shown in FIG. 8, in the 3D semiconductor device 102 in accordance with a further exemplary embodiment of the invention, at least one third semiconductor die 102c is attached to a third surface 113 of a conductive plate 110 and is electrically connected to third surfaces 123 of conductive leads 120 by third conductive wires 102d. In addition, the third semiconductor die 102c and the third conductive wires 102d can be enclosed by an encapsulant (not shown).

Figure 9A:
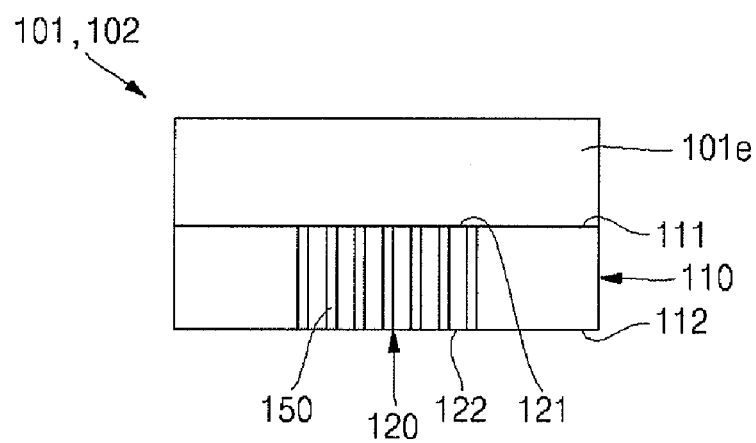
Figure 9B:
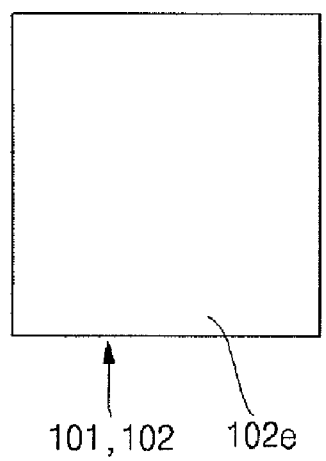
Figure 9C:
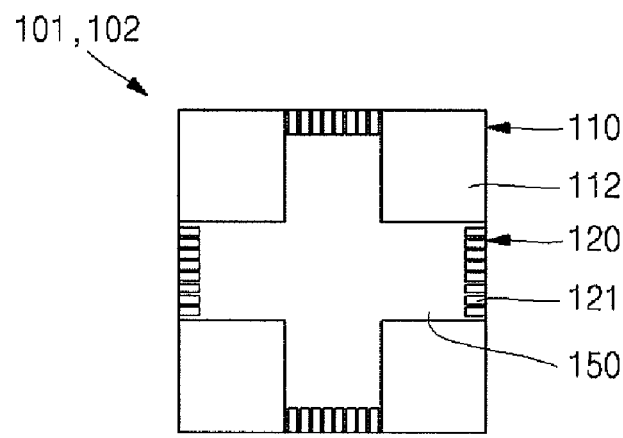

FIG. 9A is a side elevation view illustrating the 3D semiconductor devices 101 and 102 in accordance with another or a further exemplary embodiment of the invention, after encapsulation is performed, FIG. 9B is a top plan view of the 3D semiconductor device 101 or 102 shown in FIG. 9A, and FIG. 9C is a bottom view of the 3D semiconductor device 101 or 102 shown in FIG. 9A.

The 3D semiconductor device shown in FIGS. 9A through 9C is produced by encapsulating the semiconductor device 101 or 102 shown in FIG. 7 or 8. As shown in the figures, in the 3D semiconductor device 101 or 102, a second encapsulant 101e completely encloses the first surface 111 of the conductive plate 110 and the first surfaces 121 of the conductive leads 120, thereby protecting the second semiconductor die 101a and the second conductive wires 101b from the external environment. Of course, the second surface 112 of the conductive plate 110 and the second surfaces 122 of the conductive leads 120 are still exposed to the outside.

The semiconductor devices 101 and 102 can be fabricated by the following method.

For an instance, the semiconductor devices 101 and 102 can be fabricated by lead frame preparation (the term "lead frames" is used to collectively denote the conductive plate 110 and the conductive leads 120), first semiconductor die attachment, first wire bonding, first encapsulation, second semiconductor die attachment, second wire bonding, and second encapsulation.

For another instance, the semiconductor devices 101 and 102 can also be fabricated by lead frame preparation (the term "lead frames" is used to collectively denote the conductive plate 110 and the conductive leads 120), first semiconductor die attachment, first wire bonding, second semiconductor die attachment, second wire bonding, and encapsulation.

Of course, the semiconductor devices 101 and 102 can be fabricated by a variety of other methods in addition to the above-described methods, but the present invention is not limited thereto.

Figure 10:
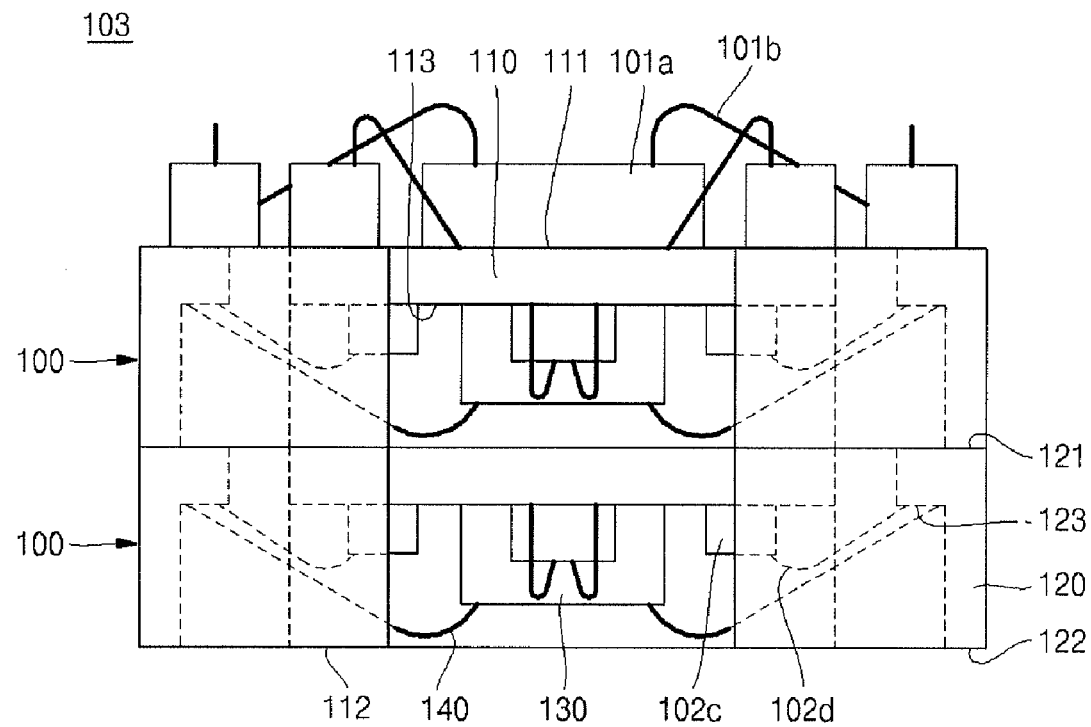
FIG. 10 is a cross-sectional view illustrating a 3D semiconductor device in accordance with further another exemplary embodiment of the invention, after wire bonding and stacking are performed.

FIG. 10 is a cross-sectional view illustrating a 3D semiconductor device 103 in accordance with further another exemplary embodiment of the invention, after wire bonding and stacking are performed.

As shown in FIG. 10, the 3D semiconductor device 103 in accordance with further another exemplary embodiment of the invention can be constructed by vertically stacking the same 3D semiconductor devices, particularly, a plurality of 3D semiconductor devices 100 one on another. For example, second surfaces 122 of conductive leads 120 of the upper 3D semiconductor device 100 can be electrically connected to first surfaces 121 of conductive leads 120 of the lower 3D semiconductor device 100. In addition, the electrical connection can be accomplished by, but not limited to, a solder or an equivalent thereof. Of course, a second semiconductor die 101a, second conductive wires 101b, and a second encapsulant (not shown) can be provided on top of the upper 3D semiconductor device 100.

Figure 11:
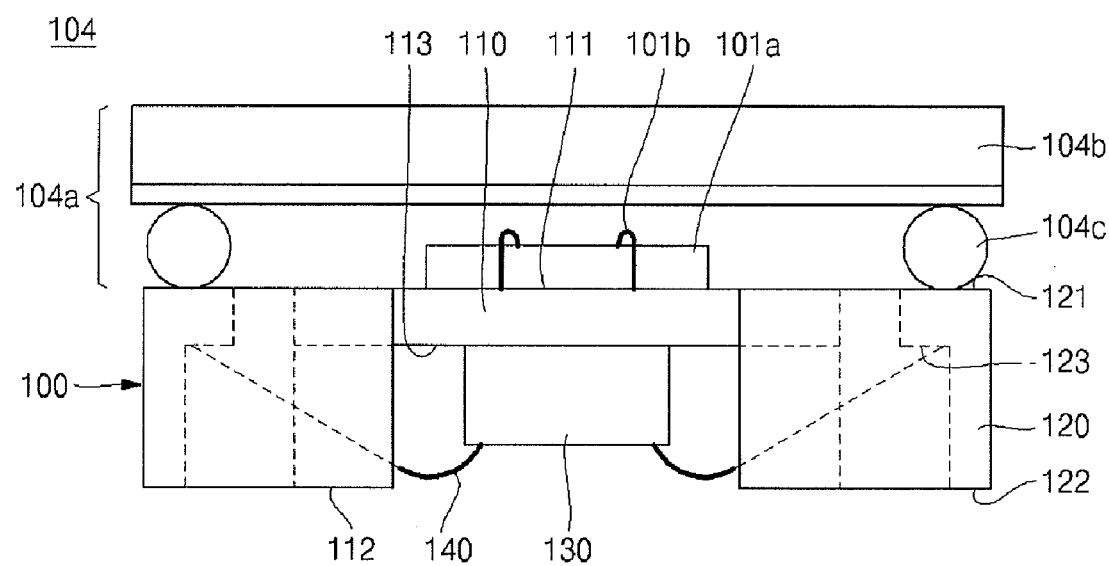
FIG. 11 is a cross-sectional view illustrating a 3D semiconductor device in accordance with still another exemplary embodiment of the invention, after wire bonding and stacking are performed.

FIG. 11 is a cross-sectional view illustrating a 3D semiconductor device 104 in accordance with still another exemplary embodiment of the invention, after wire bonding and stacking are performed.

As shown in FIG. 11, the 3D semiconductor device 104 in accordance with further another exemplary embodiment of the invention can be constructed by vertically stacking different types of semiconductor devices on each other, particularly, stacking a second semiconductor device 104a on top of a 3D semiconductor device 100. Although the second semiconductor device 104a is illustrated as including a semiconductor die 104b and solder balls 104c, the second semiconductor device 104a is not limited thereto.

Figure 12:
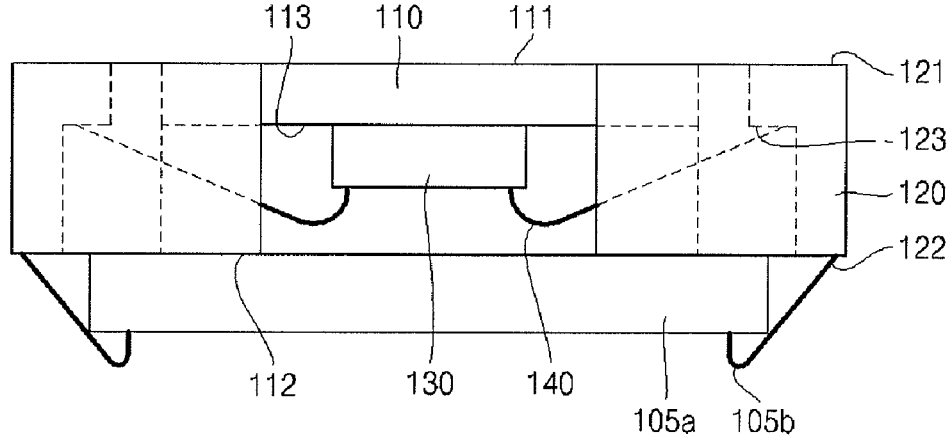
FIG. 12 is a cross-sectional view illustrating a 3D semiconductor device in accordance with yet another exemplary embodiment of the invention, after wire bonding and stacking are performed.

FIG. 12 is a cross-sectional view illustrating a 3D semiconductor device 105 in accordance with yet another exemplary embodiment of the invention, after wire bonding and stacking are performed.

As shown in FIG. 12, in the 3D semiconductor device 105 in accordance with still another exemplary embodiment of the invention, at least one second semiconductor die 105a is bonded onto a second surface 112 of a conductive plate 110 and is electrically connected to second surfaces 122 of conductive leads 120 by second conductive wires 105b. In addition, the second semiconductor die 105a and the second conductive wires 105b can be enclosed by a second encapsulant (not shown) so as to be protected from the external environment.

Figure 13:
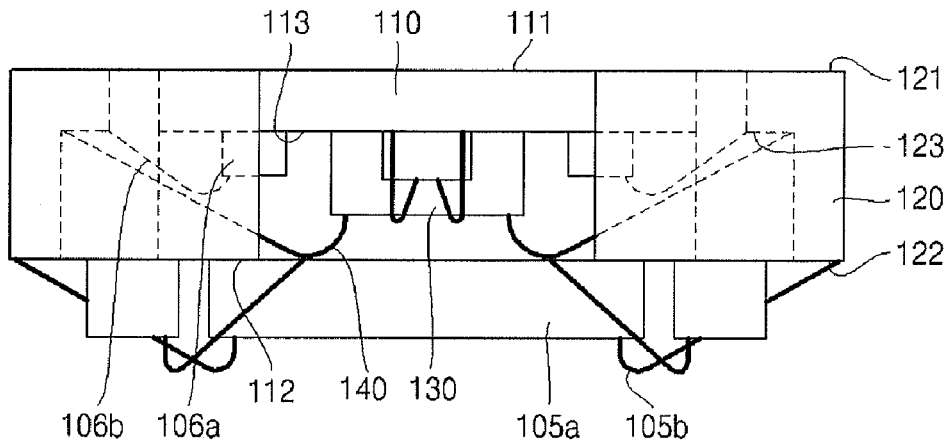
FIG. 13 is a cross-sectional view illustrating a 3D semiconductor device in accordance with another exemplary embodiment of the invention, after wire bonding and stacking are performed.

FIG. 13 is a cross-sectional view illustrating a 3D semiconductor device 106 in accordance with another exemplary embodiment of the invention, after wire bonding and stacking are performed.

As shown in FIG. 13, the 3D semiconductor device 106 in accordance with another exemplary embodiment of the invention also includes a third semiconductor die 106a bonded onto a third surface 113 of a conductive plate 110 and a plurality of conductive wires 106b electrically connecting the third semiconductor die 106a to conductive leads 120. In addition, the third semiconductor die 106a and the third conductive wires 106b can be enclosed by an encapsulant (not shown) so as to be protected from the external environment.

Figure 14:
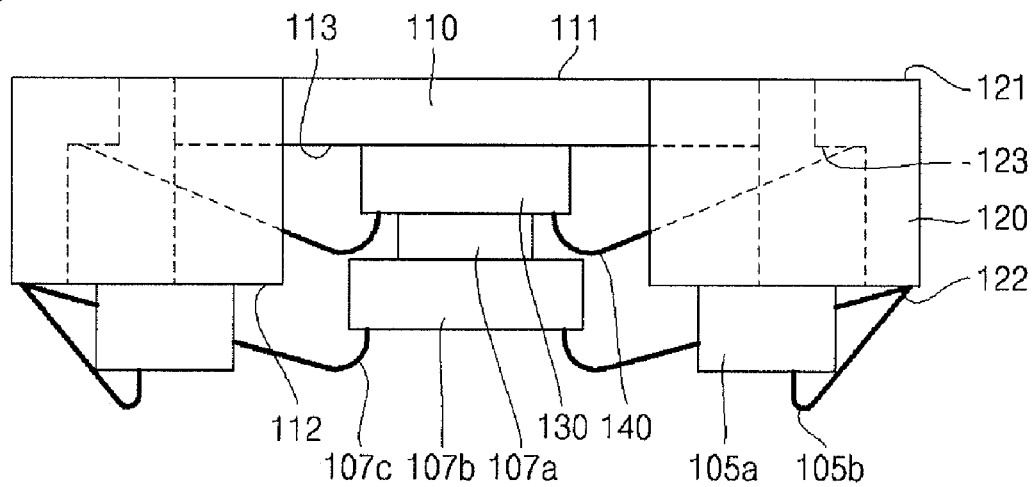
FIG. 14 is a cross-sectional view illustrating a 3D semiconductor device in accordance with a further exemplary embodiment of the invention, after wire bonding and stacking are performed.

FIG. 14 is a cross-sectional view illustrating a 3D semiconductor device 106 in accordance with a further exemplary embodiment of the invention, after wire bonding and stacking are performed.

As shown in FIG. 14, the 3D semiconductor device 106 in accordance with a further exemplary embodiment of the invention also includes a spacer 107a bonded onto the underside of a semiconductor die 130, a third semiconductor die 107b bonded onto the spacer 107a, and third conductive wires 107c electrically connecting the third semiconductor die 107b to conductive leads 120. Of course, the spacer 107a, the third semiconductor die 107b, and the third conductive wires 107c can be enclosed by an encapsulant (not shown) so as to be protected from the external environment.

Figure 15A:
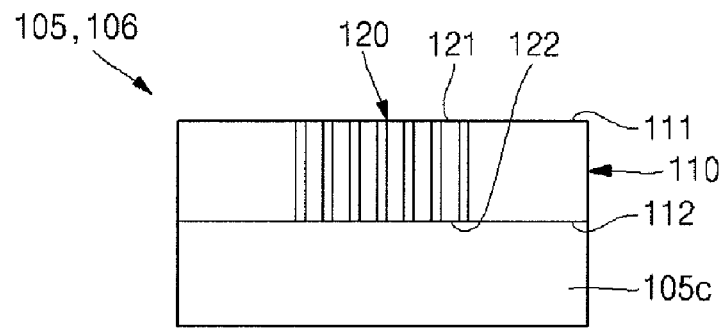
Figure 15B:
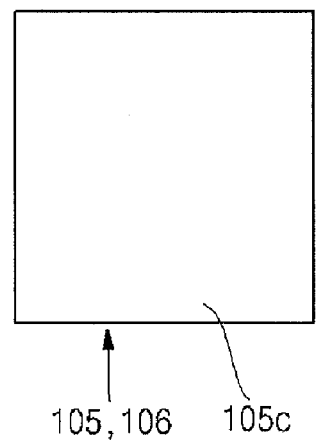
Figure 15C:
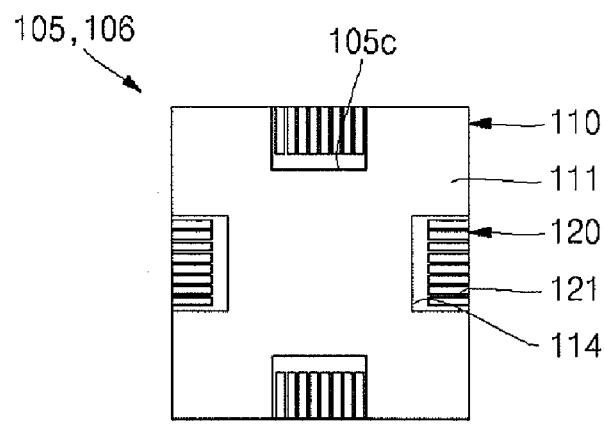

FIG. 15A is a side elevation view illustrating the 3D semiconductor device 105 or 106 in accordance with another or a further exemplary embodiment of the invention, after encapsulation is performed, FIG. 15B is a top plan view of the 3D semiconductor device 105 or 106 shown in FIG. 15A, and FIG. 15C is a bottom view of the 3D semiconductor device 105 or 106 shown in FIG. 15A.

The 3D semiconductor device 105 or 106 shown in FIGS. 15A through 15C is produced by encapsulating the 3D semiconductor device 105 or 106 shown in FIG. 12 or 13. As shown in the figures, in the 3D semiconductor device 105 or 106, a second encapsulant 105c protects the second semiconductor die 105a and the second conductive wires 105b from the external environment by completely enclosing the second surface 122 of the conductive plate 110. Of course, the first surface of the conductive plate 110 is still exposed to the outside.

Figure 16:
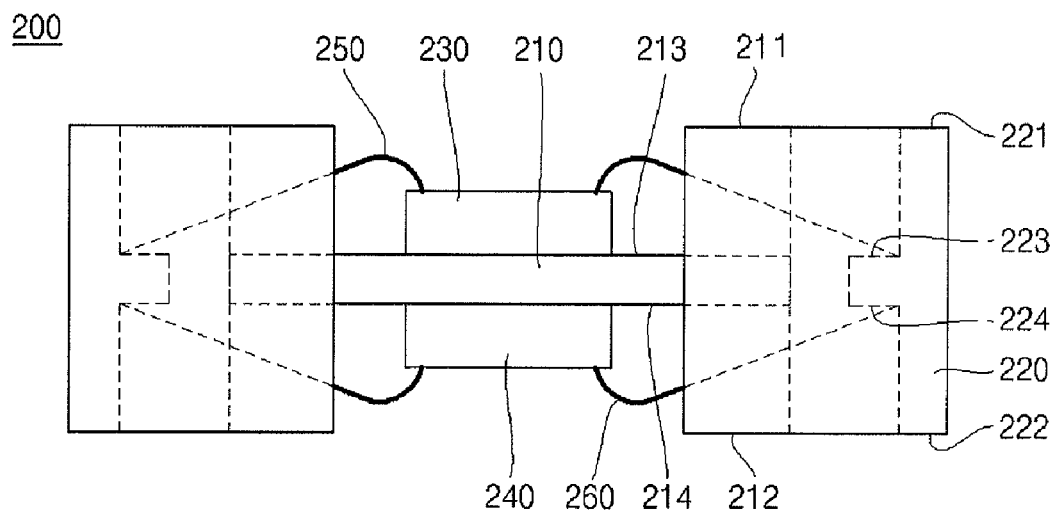
FIG. 16 is a cross-sectional view illustrating a 3D semiconductor device in accordance with further another exemplary embodiment of the invention, after wire bonding is performed.
Figure 17:
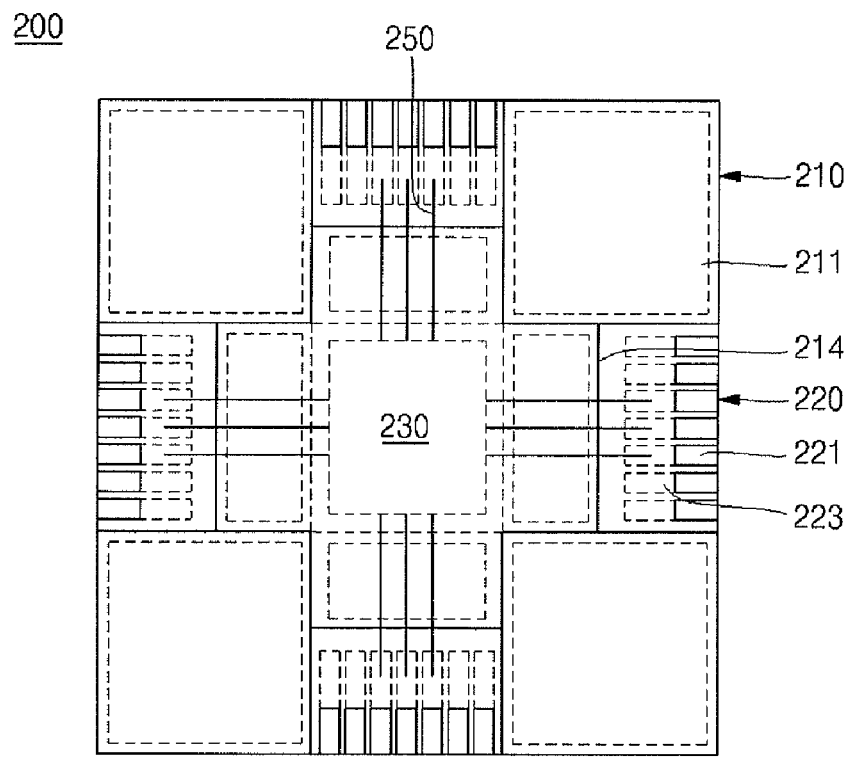
FIG. 17 is a top plan view of the 3D semiconductor device shown in FIG. 16.
Figure 18:
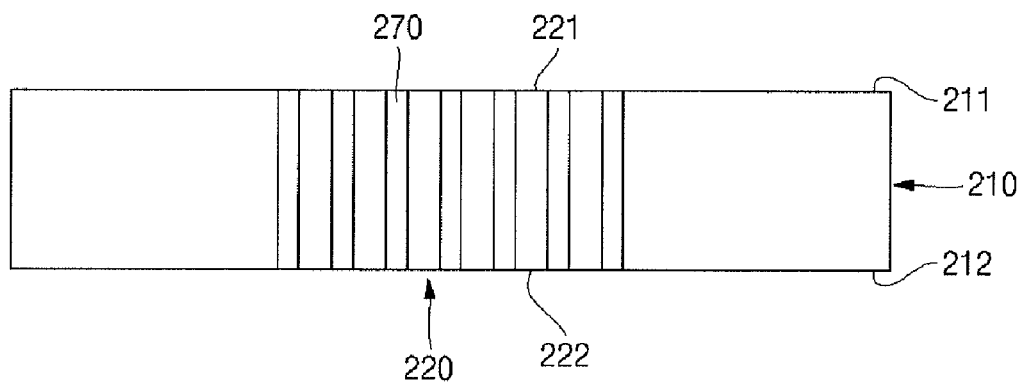
FIG. 18 is a side elevation view of the 3D semiconductor device shown in FIG. 16, after encapsulation is performed.
Figure 19:
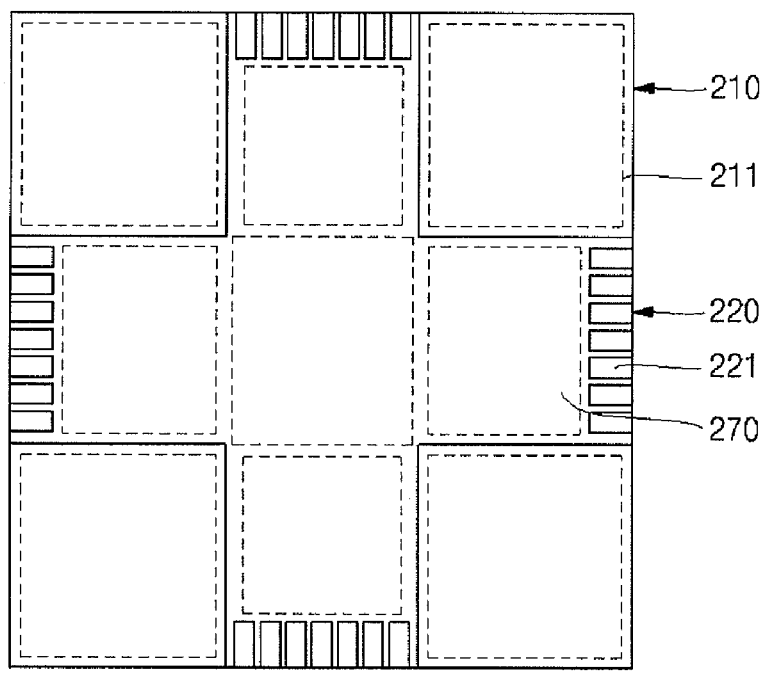
FIG. 19 is a top plan view of the 3D semiconductor device shown in FIG. 18.

FIG. 16 is a cross-sectional view illustrating a 3D semiconductor device 200 in accordance with further another exemplary embodiment of the invention, after wire bonding is performed, FIG. 17 is a top plan view of the 3D semiconductor device 200 shown in FIG. 16, FIG. 18 is a side elevation view of the 3D semiconductor device 200 shown in FIG. 16, after encapsulation is performed, and FIG. 19 is a top plan view of the 3D semiconductor device 200 shown in FIG. 18.

Referring to FIGS. 16 through 19, the 3D semiconductor device 200 of this exemplary embodiment includes a conductive plate 210, conductive leads 220, first and second semiconductor dies 230 and 240, first and second conductive wires 250 and 260, and an encapsulant 270.

The conductive plate 210 has a substantially rectangular configuration with four (4) sides. Four (4) recesses 214 are formed with a predetermined depth, in substantially the middle of the four sides, respectively. In addition, the conductive plate 210 has a substantially planar first surface 211 and a substantially planar second surface 212 opposite to the first surface 211. The conductive plate 210 also has substantially planar third and fourth surfaces 213 and 214. The third surface 213 is located opposite to the first surface 211, between the first and second surfaces 211 and 212, so as to connect the recesses 214 into the form of a cross. The fourth surface 214 is located opposite to the first surface 211, between the first and second surfaces 211 and 212, so as to connect the recesses 214 into the form of a cross. With this configuration, the thickness between the third and fourth surfaces 213 and 214 is less than the thickness between the first and second surfaces 211 and 212. In addition, dotted lines in FIGS. 17 and 19 denote the areas on which different semiconductor dies can be further attached. The conductive plate 210 can be made of, but not limited to, Cu, Cu alloy, Cu—Ni alloy, Cu—Fe alloy, alloy 42, or an equivalent thereof.

The conductive leads 220 are arrayed in line inside the recesses 214 of the conductive plate 210. Each of the conductive leads 220 has a substantially planar first surface 221 and a substantially planar second surface 222 opposite to the first surface 221. The conductive lead 220 also has substantially planar third and fourth surfaces 223 and 224 formed between the first and second surfaces 221 and 222. The third surface 223 is opposite to the second surface 222, and the fourth surface 224 is opposite to the first surface 221. With this configuration, the thickness between the third and fourth surfaces 223 and 224 is less than the thickness between the first and second surfaces 221 and 222. The conductive lead 220 can be made of, but not limited to, Cu, Cu alloys, Cu—Ni alloy, Cu—Fe alloy, alloy 42, or an equivalent thereof The first surface 221 of the conductive lead 220 is flush with the first surface 211 of the conductive plate 210, the second surface 222 of the conductive lead 220 is flush with the second surface 212 of the conductive plate 210, the third surface 223 of the conductive lead 220 is flush with the third surface 213 of the conductive plate 210, and the fourth surface 224 of the conductive lead 220 is flush with the fourth surface 214 of the conductive plate 210.

The first semiconductor die 230 is bonded onto substantially the central area of the third surface 213 of the conductive plate 210. Of course, the first semiconductor die 230 can also be bonded onto the areas denoted by dotted lines in FIG. 17. The thickness of the first semiconductor die 230 is less than the thickness between the third and first surfaces 213 and 211 of the conductive plate 210. Specifically, the thickness of the first semiconductor die 230 is less than the thickness between the third and first surfaces 213 and 211 of the conductive lead 220.

The second semiconductor die 240 is bonded onto substantially the central area of the fourth surface 214 of the conductive plate 210. Of course, the second semiconductor die 240 can also be bonded onto the areas denoted by dotted lines in FIG. 17. The thickness of the first semiconductor die 240 is less than the thickness between the fourth and second surfaces 214 and 212 of the conductive plate 210. Specifically, the thickness of the first semiconductor die 240 is less than the thickness between the fourth and second surfaces 214 and 212 of the conductive lead 220.

The first conductive wires 250 electrically connect the first semiconductor die 230 to the third surfaces 223 of the conductive leads 220. The loop of the first conductive wires 250 does not protrude beyond the first surface 211 of the conductive plate 210 or the first surface 221 of the conductive lead 220. This configuration can ensure a thin profile to the semiconductor device 200 by preventing the encapsulant 270, which will be described layer, from bulging above the first surface 211 of the conductive plate 210 or the first surface 221 of the conductive lead 220. The conductive wires 250 can be in the form of, but not limited to, Au wires, Cu wires, or an equivalent thereof.

The second conductive wires 260 electrically connect the second semiconductor die 240 to the fourth surfaces 224 of the conductive leads 220. The loop of the second conductive wires 260 does not protrude beyond the second surface 212 of the conductive plate 210 or the second surface 222 of the conductive lead 220. This configuration can ensure a thin profile to the semiconductor device 200 by preventing the encapsulant 270, which will be described layer, from bulging above the second surface 212 of the conductive plate 210 or the second surface 222 of the conductive lead 220. The conductive wires 260 can be in the form of, but not limited to, Au wires, Cu wires, or an equivalent thereof.

The encapsulant 270 encloses, as in a capsule, the conductive plate 210, the conductive leads 220, the first and second semiconductor dies 230 and 240, and the first and second conductive wires 250 and 260 in such a manner that the first and second surfaces 211 and 212 of the conductive plate 210 and the first and second surfaces 221 and 222 of the conductive leads 220 are exposed to the outside. In this manner, as shown in FIG. 19, the first and second surfaces 211 and 212 of the conductive plate 210, at four corners, are completely exposed to the outside of the encapsulant 270. Of course, as shown in FIG. 19, the encapsulant 270 has a substantially cross shape. In addition, the side surfaces of the conductive plate 210 and the conductive leads 220 are also exposed through the side of the encapsulant 270. The encapsulant 270 can be made of, but not limited to, an epoxy molding compound or an equivalent thereof.

Figure 20:
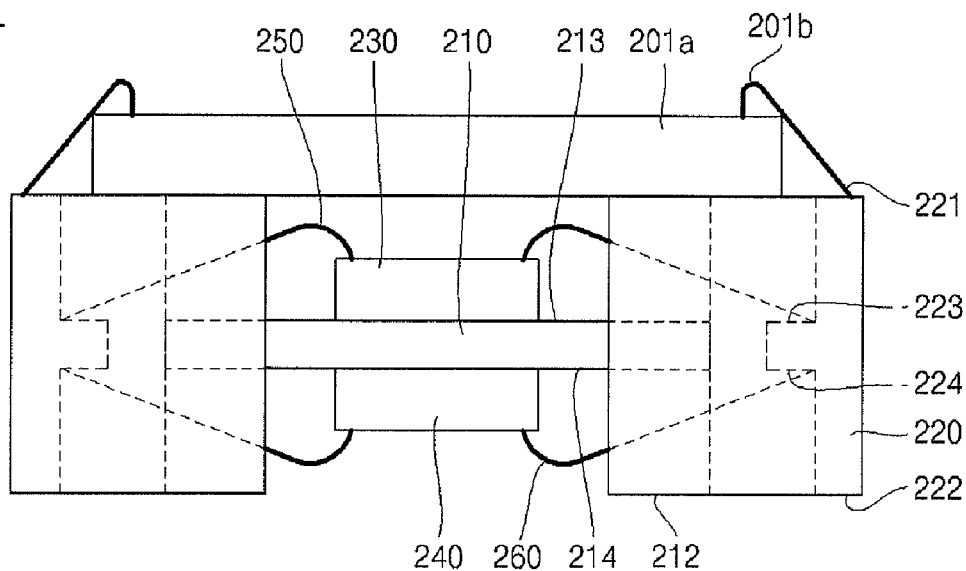
FIG. 20 is a cross-sectional view illustrating a 3D semiconductor device in accordance with still another exemplary embodiment of the invention, after wire bonding and stacking are performed.

FIG. 20 is a cross-sectional view illustrating a 3D semiconductor device 201 in accordance with still another exemplary embodiment of the invention, after wire bonding and stacking are performed.

As shown in FIG. 20, in the 3D semiconductor device 201 in accordance with another exemplary embodiment of the invention, at least one second semiconductor die 201a is bonded onto a first surface 211 of a conductive plate 210 and is electrically connected to first surfaces 221 of conductive leads 220 by second conductive wires 201b. In addition, the second semiconductor die 201a and the second conductive wires 201b can be enclosed by a second encapsulant (not shown).

Figure 21:
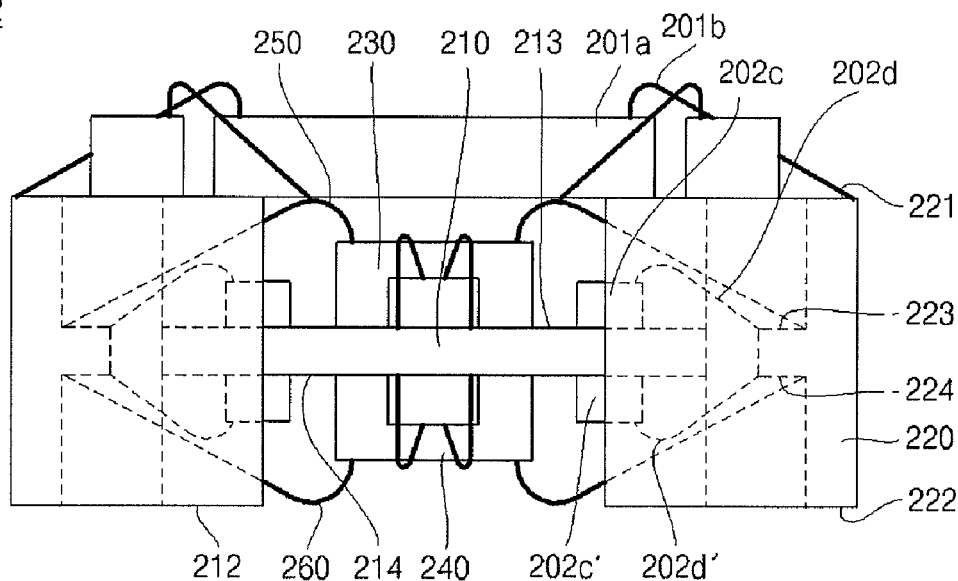
FIG. 21 is a cross-sectional view illustrating a 3D semiconductor device in accordance with yet another exemplary embodiment of the invention, after wire bonding and stacking are performed.

FIG. 21 is a cross-sectional view illustrating a 3D semiconductor device 202 in accordance with yet another exemplary embodiment of the invention, after wire bonding and stacking are performed.

As shown in FIG. 21, in the 3D semiconductor device 202 in accordance with yet another exemplary embodiment of the invention, one or more third semiconductor dies 202c are attached to a third surface 213 and/or a fourth surface 214 of a conductive plate 210 and are electrically connected to third surfaces 223 and/or fourth surfaces 224 of conductive leads 220 by third conductive wires 202d. In addition, the third semiconductor die 202c and the third conductive wires 202d can be enclosed by an encapsulant (not shown).

The semiconductor devices 201 and 202 as described above can be fabricated by the following method.

For an instance, the semiconductor devices 201 and 202 can be fabricated by lead frame preparation (the term "lead frames" is used to collectively denote the conductive plate 210 and the conductive leads 220), first semiconductor die attachment, first wire bonding, first encapsulation, second semiconductor die attachment, second wire bonding, and second encapsulation.

For another instance, the semiconductor devices 201 and 202 can also be fabricated by lead frame preparation (the term "lead frames" is used to collectively denote the conductive plate 210 and the conductive leads 220), first semiconductor die attachment, first wire bonding, second semiconductor die attachment, second wire bonding, and encapsulation.

Of course, the semiconductor devices 201 and 202 can be fabricated by a variety of other methods in addition to the above-described methods, but the present invention is not limited thereto.

Figure 22A:
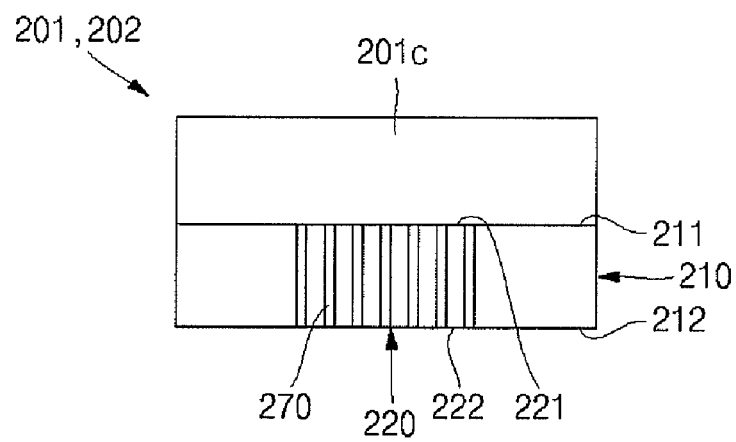
Figure 22B:
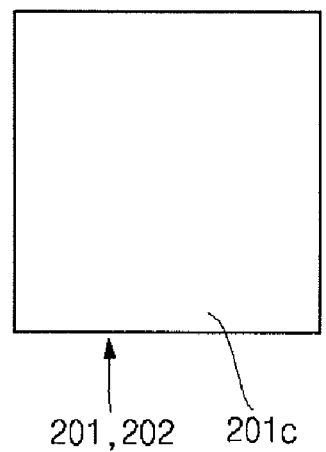
Figure 22C:
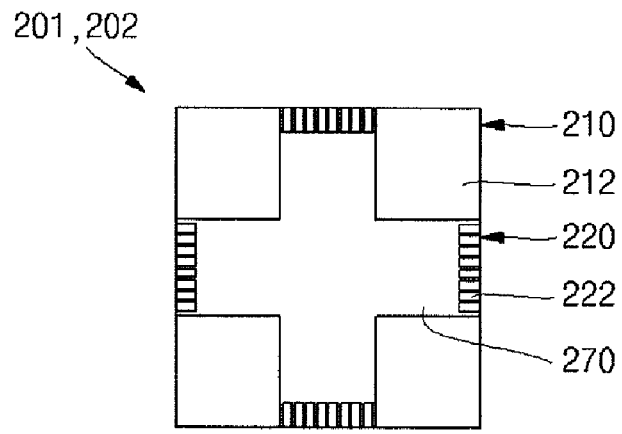

FIG. 22A is a side elevation view illustrate the 3D semiconductor device 201 or 202 in accordance with still or yet another exemplary embodiment of the invention, after encapsulation is performed, FIG. 22B is a top plan view of the 3D semiconductor device 201 or 202 shown in FIG. 22A, and FIG. 22C is a bottom view of the 3D semiconductor device 201 or 202 shown in FIG. 22A.

The 3D semiconductor device 201 or 202 shown in FIGS. 22A through 22C is produced by encapsulating the semiconductor device 201 or 202 shown in FIG. 20 or 21. As shown in the figures, a second encapsulant 201c protects the second semiconductor die 201a and the second conductive wires 201b from the external environment by completely enclosing the first surface 211 of the conductive plate 210 and the first surfaces 221 of the conductive leads 220. Of course, the second surface 212 of the conductive plate 210 and the second surfaces 222 of the conductive leads 220 are still exposed to the outside.

Figure 23:
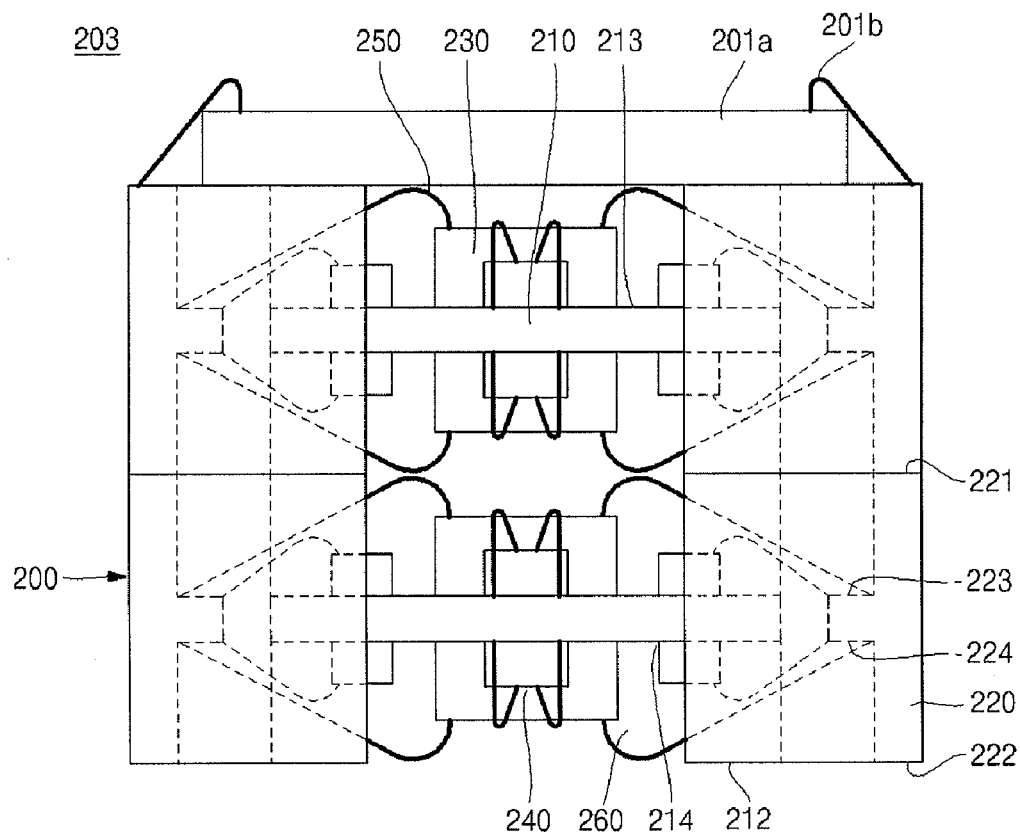
FIG. 23 is a cross-sectional view illustrating a 3D semiconductor device in accordance with another exemplary embodiment of the invention, after wire bonding and stacking are performed.

FIG. 23 is a cross-sectional view illustrating a 3D semiconductor device 203 in accordance with another exemplary embodiment of the invention, after wire bonding and stacking are performed.

As shown in FIG. 23, the 3D semiconductor device 203 in accordance with another exemplary embodiment of the invention can be constructed by vertically stacking the same 3D semiconductor devices, particularly, a plurality of 3D semiconductor devices 200 one on another. For example, second surfaces 222 of conductive leads 220 of the upper 3D semiconductor device 200 can be electrically connected to first surfaces 221 of conductive leads 220 of the lower 3D semiconductor device 200. Electrical connection can be accomplished by, but not limited to, a solder or an equivalent thereof. Of course, a second semiconductor die 201a, second conductive wires 201b, and a second encapsulant (not shown) can be provided on top of the upper 3D semiconductor device 200.

Figure 24:
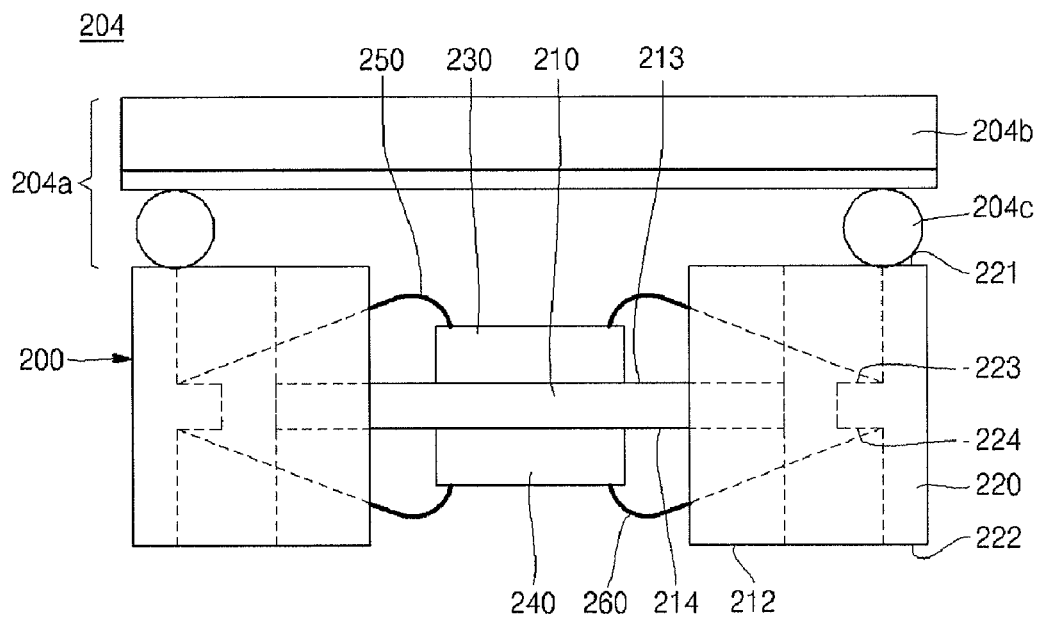
FIG. 24 is a cross-sectional view illustrating a 3D semiconductor device in accordance with yet another exemplary embodiment of the invention, after wire bonding and stacking are performed.

FIG. 24 is a cross-sectional view illustrating a 3D semiconductor device 204 in accordance with yet another exemplary embodiment of the invention, after wire bonding and stacking are performed.

As shown in FIG. 24, the 3D semiconductor device 204 in accordance with yet another exemplary embodiment of the invention can be constructed by vertically stacking different types of semiconductor devices on each other, particularly, stacking a second semiconductor device 204a on top of a 3D semiconductor device 200. Although the second semiconductor device 204a is illustrated as including a semiconductor die 204b and solder balls 204c, the second semiconductor device 204a is not limited thereto.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A three-dimensional semiconductor device comprising:
 a conductive plate defining four sides and four recesses formed in the four sides, respectively, wherein the conductive plate has first and second surfaces opposite to each other;
 a plurality of conductive leads located in the recesses, respectively, wherein the conductive leads have first and second surfaces opposite to each other;
 a semiconductor die attached onto a central area of the conductive plate;
 a plurality of conductive wires electrically connecting the semiconductor die to the conductive leads; and
 an encapsulant enclosing, as in a capsule, the conductive plate, the conductive leads, the semiconductor die, and the conductive wires in such a manner that the first and second surfaces of the conductive plate and the first and second surfaces of the conductive leads are exposed to outside; and
 wherein the conductive plate further has a third surface opposite to the first surface, located between the first and second surfaces, wherein the third surface connects the recesses with each other, wherein the semiconductor die is attached onto a central portion of the third surface.

2. The three-dimensional semiconductor device in accordance with claim 1, wherein the leads further have a third surface opposite to the first surface, located between the first and second surfaces, wherein the conductive wires are connected to the third surface.

3. The three-dimensional semiconductor device in accordance with claim 1, further comprising:
   at least one second semiconductor die attached onto the first surface of the conductive plate, wherein the second semiconductor die is electrically connected to the first surface of the conductive leads by a second conductive wire; and
   a second encapsulant enclosing the second semiconductor die and the second conductive wire.

4. The three-dimensional semiconductor device in accordance with claim 1, further comprising:
   at least one second semiconductor die attached onto the third surface of the conductive plate, wherein the second semiconductor die is electrically connected to the third surface of the conductive leads by a second conductive wire; and
   a second encapsulant enclosing the second semiconductor die and the second conductive wire.

5. The three-dimensional semiconductor device in accordance with claim 1, wherein a plurality of the three-dimensional semiconductor devices are stacked one on another in a vertical direction.

6. The three-dimensional semiconductor device in accordance with claim 1, wherein a different type of second semiconductor device is stacked on the three-dimensional semiconductor device in a vertical direction.

7. The three-dimensional semiconductor device in accordance with claim 1, further comprising:
   at least one second semiconductor die attached onto the second surface of the conductive plate, wherein the second semiconductor die is electrically connected to the second surface of the conductive leads by a second conductive wire; and
   a second encapsulant enclosing the second semiconductor die and the second conductive wire.

8. The three-dimensional semiconductor device in accordance with claim 1, further comprising:
   a spacer attached onto an underside of the semiconductor die;
   a second semiconductor die attached onto the spacer, wherein the second semiconductor die is electrically connected to the first surface of the conductive leads by a second conductive wire; and
   a second encapsulant enclosing the spacer, the second semiconductor die, and the second conductive wire.

9. A three-dimensional semiconductor device comprising:
   a conductive plate defining four sides and four recesses formed in the four sides, respectively, wherein the conductive plate has first and second surfaces opposite to each other;
   a plurality of conductive leads located in the recess, respectively, wherein the conductive leads have first and second surfaces opposite to each other;
   a first semiconductor die attached onto an upper central area of the conductive plate;
   a second semiconductor die attached onto a lower central area of the conductive plate;
   a plurality of first conductive wires electrically connecting the first semiconductor die to the conductive leads;
   a plurality of second conductive wires electrically connecting the second semiconductor die to the conductive leads; and
   an encapsulant enclosing, as in a capsule, the conductive plate, the conductive leads, the first and second semiconductor dies, and the first and second conductive wires such that the first and second surfaces of the conductive plate and the first and second surfaces of the conductive leads are exposed to outside; and
   wherein the conductive plate further has:
      a third surface opposite to the first surface, located between the first and second surfaces, wherein the third surface connects the recesses with each other, and wherein the first semiconductor die is attached onto a central portion of the third surface; and
      a fourth surface opposite to the first surface, located between the first and second surfaces, wherein the third surface connects the recesses with each other, and wherein the second semiconductor die is attached onto a central portion of the fourth surface.

10. The three-dimensional semiconductor device in accordance with claim 9, wherein the leads further have:
   a third surface opposite to the first surface, located between the first and second surfaces, wherein the conductive wires are connected to the third surface; and
   a fourth surface opposite to the first surface, located between the first and second surfaces, wherein the conductive wires are connected to the fourth surface.

11. The three-dimensional semiconductor device in accordance with claim 9, further comprising at least one third semiconductor die attached onto the first surface of the conductive plate, wherein the third semiconductor die is electrically connected to the first surface of the conductive leads by a third conductive wire, and wherein the third semiconductor die and the third conductive wire are enclosed by the encapsulant.

12. The three-dimensional semiconductor device in accordance with claim 9, wherein a plurality of the three-dimensional semiconductor devices are stacked one on another in a vertical direction.

13. The three-dimensional semiconductor device in accordance with claim 9, wherein a different type of second semiconductor device is stacked on the three-dimensional semiconductor device in a vertical direction.

14. A three-dimensional semiconductor device comprising:
   a conductive plate defining four sides and four recesses formed in the four sides, respectively, wherein the conductive plate has first and second surfaces opposite to each other;
   a plurality of conductive leads located in the recess, respectively, wherein the conductive leads have first and second surfaces opposite to each other;
   a first semiconductor die attached onto an upper central area of the conductive plate;
   a second semiconductor die attached onto a lower central area of the conductive plate;
   a plurality of first conductive wires electrically connecting the first semiconductor die to the conductive leads;
   a plurality of second conductive wires electrically connecting the second semiconductor die to the conductive leads;
   an encapsulant enclosing, as in a capsule, the conductive plate, the conductive leads, the first and second semiconductor dies, and the first and second conductive wires such that the first and second surfaces of the conductive plate and the first and second surfaces of the conductive leads are exposed to outside; and further comprising at least one third semiconductor die attached onto the third or fourth surface of the conductive plate, wherein the third semiconductor die is electrically connected to the third or fourth surface of the conductive leads by a third conductive wire, and wherein the third semiconductor die and the third conductive wire are enclosed by the encapsulant.

* * * * *